(12) United States Patent
Zaiser

(10) Patent No.: US 6,624,646 B2
(45) Date of Patent: Sep. 23, 2003

(54) MODULAR INTERFACE BETWEEN TEST AND APPLICATION EQUIPMENT

(75) Inventor: Jochen Zaiser, Holzgerlingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/251,860

(22) Filed: Sep. 23, 2002

(65) Prior Publication Data

US 2003/0076124 A1 Apr. 24, 2003

Related U.S. Application Data

(63) Continuation of application No. 09/642,930, filed on Aug. 22, 2000.

(30) Foreign Application Priority Data

Aug. 23, 1999 (EP) .............................................. 99116493

(51) Int. Cl.$^7$ ........................ G01R 31/02; G01R 31/26
(52) U.S. Cl. ...................................... 324/754; 324/765
(58) Field of Search ............................... 324/754, 755, 324/761, 762, 758, 765, 158.1; 714/724, 743

(56) References Cited

U.S. PATENT DOCUMENTS

| | | | |
|---|---|---|---|
| 4,724,180 A | 2/1988 | Kern | 428/131 |
| 5,453,995 A | 9/1995 | Behrens | 714/743 |
| 5,499,248 A | 3/1996 | Behrens | 714/724 |
| 5,629,631 A | 5/1997 | Perry et al. | 324/755 |
| 6,037,787 A | 3/2000 | Corwith | 324/754 |
| 6,166,553 A | 12/2000 | Sinsheimer | 324/754 |
| 6,246,245 B1 | 6/2001 | Akram et al. | 324/754 |

FOREIGN PATENT DOCUMENTS

EP 0677745 A1 10/1995

*Primary Examiner*—John E. Chapman
*Assistant Examiner*—James C. Kerveros

(57) ABSTRACT

An interface provides an electrical contact between test equipment and application equipment. The interface receives plural individual structures. At least one of the structures comprises at least one electrical path that provides the electrical contact. At least one of the structures is electrically isolated with respect to the interface and/or other structures and has a ground condition substantially independent of the ground condition of the interface and/or other structures.

31 Claims, 4 Drawing Sheets

MODULAR INTERFACE BETWEEN TEST AND APPLICATION EQUIPMENT

This application is a Continuation of application Ser. No. 09/642,930 filed Aug. 22, 2000.

BACKGROUND OF THE INVENTION

The present invention relates to interfaces between test and application equipments.

IC testers generate dedicated analog and/or digital signals that are supplied to a device under test (DUT) for analyzing the response thereof. Such testers are described in detail e.g. in the co-pending European Patent application No. 99105625.0 by the same applicant, EP-A-882991, U.S. Pat. No. 5,499,248, or U.S. Pat. No. 5,453,995.

In most cases, the provision of signals from the tester to a specific application site of the DUT has to be matched with the specific mechanical and electrical properties of the tester as well as of an application equipment handling the DUT.

FIG. 1 shows an example of a typical DUT application equipment such as a wafer prober 10 for transporting and positioning highly sensitive silicon wafers as DUTs. The wafers (not visible inside the wafer prober 10) are internally connected to a probe card 20 as interface of the wafer prober 10 towards a tester 25 (in FIG. 1 only symbolized as a general block). Wafer probers are generally applied for testing integrated circuit in the earliest possible production phase.

The probe card 20 is typically a device-specific printed circuit board (PCB), e.g. with high-density contact needles on the wafer side and gold-plated contact pads on the tester side (as the side visible in FIG. 1). The probe card 20 normally straddles the dense (needle) pattern form the wafer side to a wider pad pattern for contacting with the tester 25. The size of the probe card 20 is generally limited by the hardware of the wafer prober 10. The wafer prober 10 has to ensure a reliable electrical contact between the contact pads of the wafer and the probe card 20.

A DUT board 30 represents the electrical and mechanical interface of the tester 25 towards the DUT. The DUT board 30 normally is a device specific printed circuit board (PCB) custom-built for the specific requirements of the DUT application equipment and can be exchanged dependent on the respective application. More details about the DUT boards 30 are described in particular in the aforementioned co-pending European Patent Application No. 99105625.0. In case that the DUT board 30 is provided as a custom-built exchangeable part, the DUT board 30 is often contacted within the tester 25 by means of spring-loaded contact pins (also called "Pogo™")

While the DUT board 30 and the probe card 20 are electrically optimized (e.g. with respect to signal speed, signal purity, impedance, and transmission rate) regarding either the tester 25 or the DUT of the wafer prober 10, a good electrical and mechanical matching between the DUT board 30 and the probe card 20 has to be achieved. This becomes in particular important with increasing signal transmission rates going up to two Gigabit per second.

In the example of FIG. 1, an interface tower 50 (also called "Pogo™ tower" ) is used as interface between the DUT board 30 and the probe card 20. The interface tower 50 converts the pin pattern (normally rectangular arrangement) of the DUT board 30 of the tester 25 to the pattern (normally round and more dense) of the probe card 20. In the example of FIG. 1, the interface tower 50 further has to bring signals from the tester 25 through a round-shaped hole in a head plate 60 of the wafer prober 10 and bridge the spatial distance between the DUT board 30 and the probe card 20.

All the interfacing provided by the interface tower 50 has to be done with a minimum loss in performance for the entire test system provided by the tester 25 and the application equipment of the wafer prober 10. That means that all parts in the electrical path of the interface tower 50 have to maintain a controlled impedance (normally 50 Ω) and a high contact quality for each provided tester channel (e.g. more than 1000 channels).

FIG. 2A shows in cross sectional view an embodiment of the interface tower 50 (product number E7017AA) as used for the Hewlett-Packard HP 83000. The interface tower 50 is of cylindrical shape with a central aperture 100. A solid aluminum core 110 bears the electrical and mechanical contacts. The core 110 comprises a plurality of signal paths 120 and ground contacts 130. In the representation of FIG. 2A, the top side of the tower interface 50 is to be directed towards the DUT board 30, while the lower side of the interface tower 50 is to be directed to and to be contact with the probe card 20.

FIG. 2B shows in greater detail the electrical paths of the interface tower 50 as depicted on the left side of FIG. 2A. Each signal path 120 is provided by a double-sided spring-loaded contact (Pogo™) isolated by air within holes 140 drilled through the core 110. Ground connection is performed by the ground contacts 130 provided by single-sided ground Pogos, which are arranged around the signal paths 120 and contacted directly with the aluminum core 110. This arrangement of the ground contacts 130 together with the air-isolated holes 140 generates a 50 Ω environment, when a defined relation between the diameters of the electrical contacts of the signal paths 120 and the holes 140 is selected. Thus, the core 110 of the interface tower 50 provides a solid ground for all tester signals transmitted via the signal paths 120 and has to be isolated from a mechanical ground to avoid ground loops in the interface tower 50.

The tower interface 50, as shown in FIG. 2A, provides an excellent transmission of electrical signals between the DUT board 30 and the probe card 20. The electrical configuration of the signal paths 120 and the ground contacts 130 ensures an almost loss-free signal transmission, even for very high transmission rates with bandwidths in the range of up to 7 GHz.

The provision of the holes 140 with a defined diameter over the entire length of the holes 140, however, encounters severe mechanical difficulties. In case of the above described interface tower 50 with the product number E7017AA, holes 140 have to be provided with a diameter of 3 mm over a length of 50 mm. It is clear for the skilled person in the art that the provision of such holes is extremely difficult and costly and renders the interface tower 50 to be relatively costly. In this context, it has to be understood that each interface tower 50 normally is a specific custom-built part and usually only covers one specific pin-count (e.g. the number of individual electrical paths to be provided) for one specific tester arrangement. While, on one hand, the price of each interface tower 50 is relatively high (e.g. in the range of $ 30,000), a failure or breakdown of the interface tower 50, on the other hand, can lead to significant costs until the testing procedure can be resumed. Thus, it will be required to keep relatively costly spare interface towers 50 in stock to reduce possible test stoppage times.

SUMMARY OF THE INVENTION

It is therefore an object of the present invention to provide a lower cost interface between test and application equipment. The object is solved by the independent claims. Preferred embodiments are shown by the dependent claims.

According to the invention, an interface between test and application equipment (also referred to as tester/application interface or TA-interface) is provided with individual modular and exchangeable segments, i.e., structures. Each segment can comprise one or more electrical signal and/or ground paths or simply be a dummy segment in order to fill unused segment space with the TA-interface.

The modular arrangement of the segments allows to significantly reduce the testing costs, since the TA-interface, on one hand, can easily be adapted to a specific pin-count in a respective application. On the other hand, broken or malfunctioning segments can easily be exchanged without requiring to exchange the entire TA-interface. The TA-interface can thus be configured in accordance with the actual requirements and might also be upgraded on demand, thus allowing to distribute or shift costs until the actual moment of requirement. Furthermore, the modular segment configuration allows to limit stock costs from entire TA-interfaces to only less costly segments, in order to limit unavoidable stoppage time of the testing procedure.

In a preferred embodiment, all segments are substantially equal. In another embodiment, the TA-interface only comprises one or more different types of segments, whereby the segments of each type are equal. This further allows reducing costs due to an increased standardization and exchangeability within the segments of the same type.

In a further embodiment, one or more of the segments are electrically insulated or isolated, so that each of those one or more segments can be provided to be electrically independent with an individual electrical characteristics, such as an individual ground condition. This is in particular useful for testing DUTs with mixed analog and digital functionality.

In one embodiment, the ground condition of one or more of the electrically independent segments can be configured independently.

The invention thus provides a modular product structure allowing customer-specific configurations with lower price for lower pin-counts and rendering on site repair/exchange of segments (e.g. by the customer) possible. The invention further allows to provide segments with separated ground conditions, thus significantly increasing the flexibility of the entire test system and enabling testing of applications with mixed functionality (e.g. digital and analog).

In most cases, the TA-interface according to the invention is fully compatible with TA-interfaces already commercially available, such as within the Hewlett-Packard HP 83000 system.

In general, the TA-interface is applied for providing an electromagnetic link between test and application equipment. In most cases, however, the electromagnetic link is an electrical contact, an optical contact, or a combination of both. The test equipment preferably is an integrated circuit tester, and, accordingly, the application equipment preferably is an integrated circuit handling equipment.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF THE INVENTION

Figure 1:
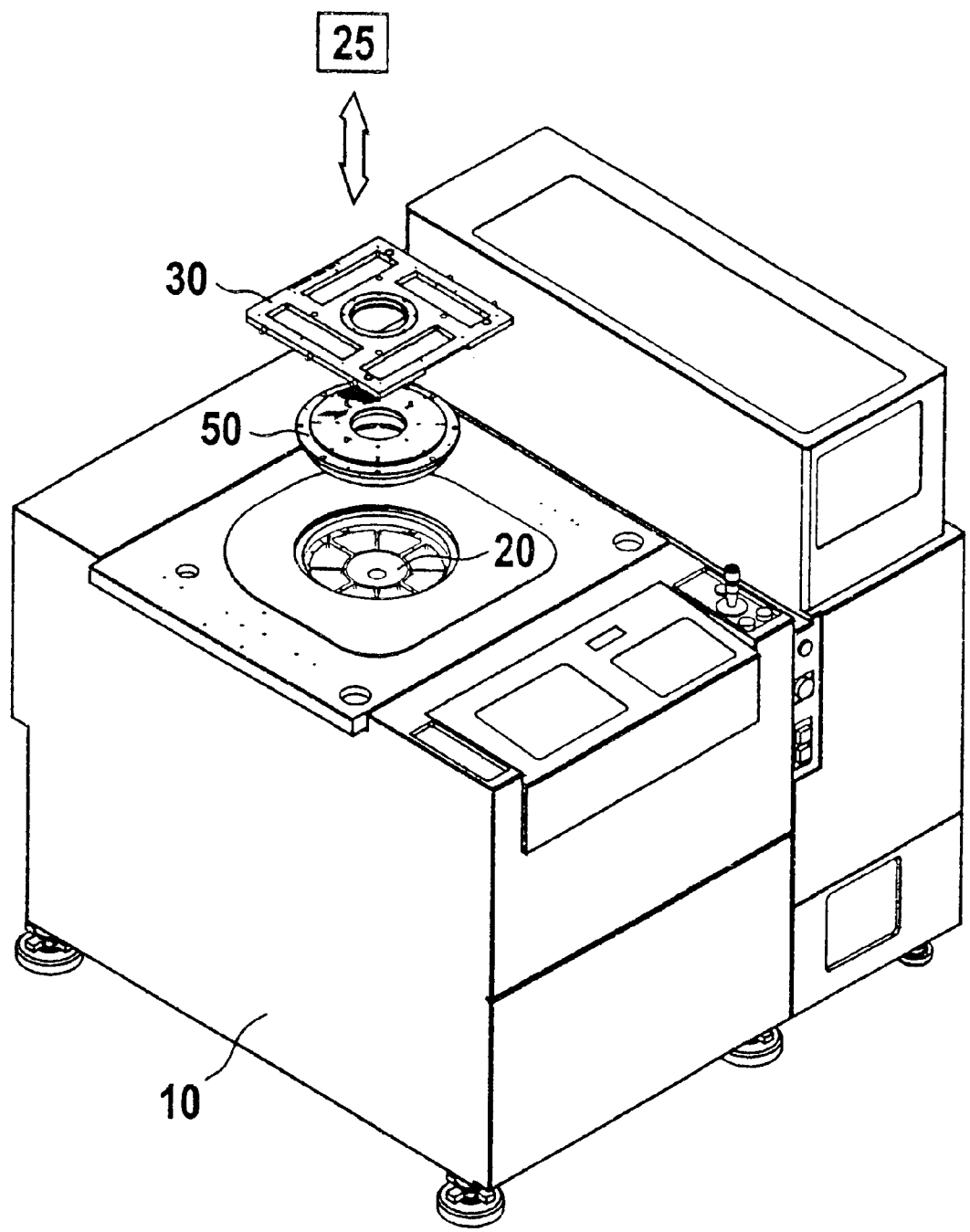
FIG. 1 shows an example of a typical DUT application equipment.
Figure 3:
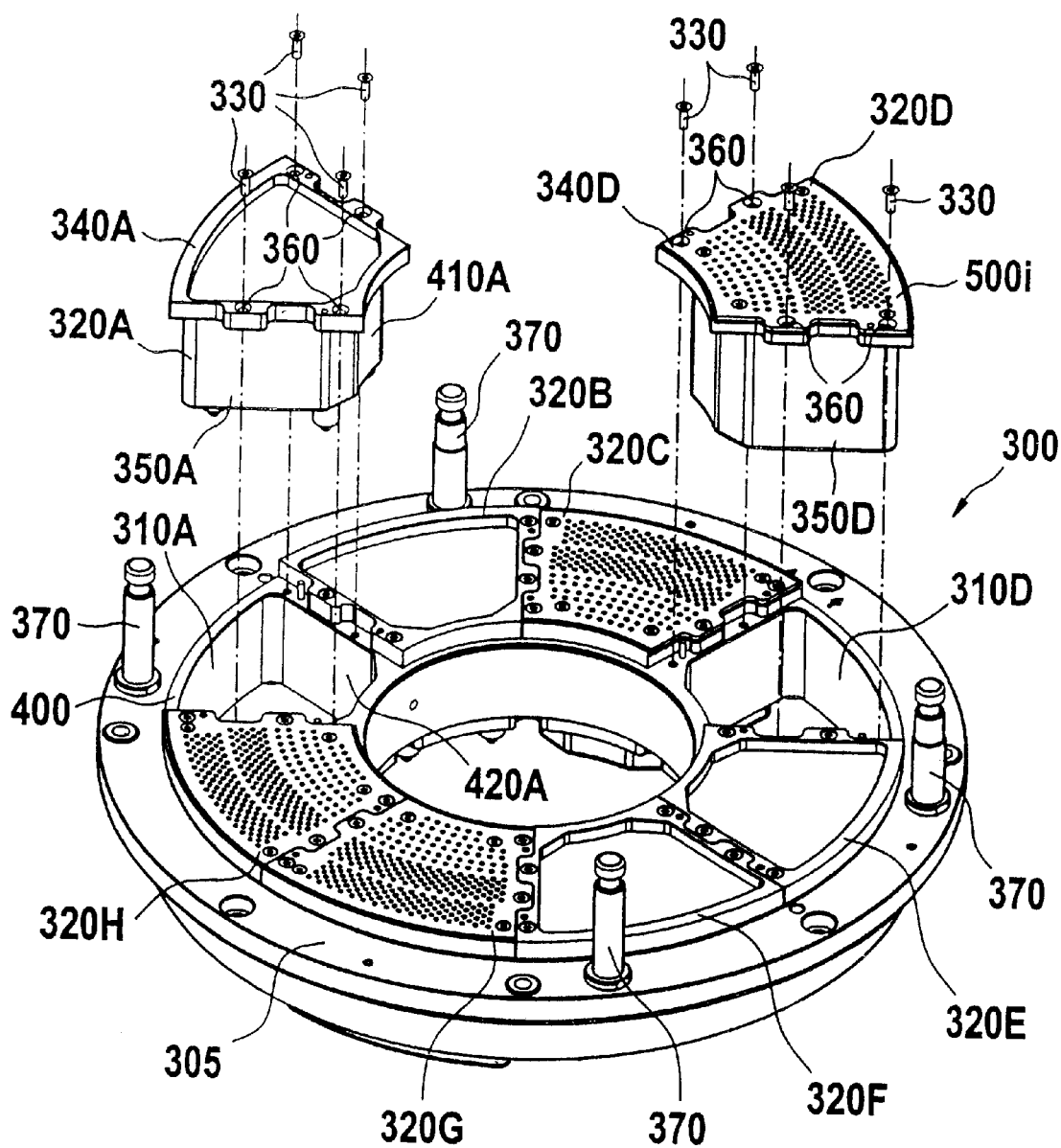
FIG. 3 shows an embodiment of an interface tower 300 according to the invention.

FIG. 3 shows an embodiment of an interface tower 300 as an example of a TA-interface according to the invention. The interface tower 300 is depicted in FIG. 3 in the same way as the interface tower 50 in FIG. 1, so that the shown upper side of the interface tower 300 is intended to be contacted with the DUT board 30, while the lower side is intended to be contacted with the probe card 20. The interface tower 300 according to the invention can be provided fully compatible with the interface tower 50 as shown in FIG. 1, so that the interface tower 300 can be applied in the same way as shown by and described for FIG. 1.

The interface tower 300 comprises a frame 305 with a plurality of recesses 310$i$ (with i=A, B, C, . . . ), each one adapted to receive a respective segment 320$i$ (with i=A, B, C, . . .). In the-embodiment of FIG. 3, the interface tower 300 comprises eight recesses 320A . . . 320H, each filled with a respective segment 320A . . . 320H. In the explosive view of FIG. 3, the segments 320A and 320D are represented spaced off from-the interface tower 300. As further apparent from FIG. 3, segments 320A, 320B, 320E and 320F are embodied as blank or dummy segments bearing no electrical contacts, while segments 320C, 320D, 320G and 320H are embodied as segments with a plurality of electrical contacts for establishing an electrical contact between respective contacts of the DUT board 30 and the probe card 20.

Each segment 320$i$ can be fixed to the frame 305 of the interface tower 300 e.g. by means of screws 330. For that purpose, each segment 320$i$ is provided on its upper side with a flange 340$i$ laterally extending over a body 350$i$ to be inserted into the respective recess 310 $i$.

Each flange 340$i$ comprises holes 360. For fixing the segment 320$i$ to the frame 305, the screws 330 are inserted into the holes 360 and screwed to the frame 305.

On its upper side, the interface tower 300 further comprises rods 370 for adjusting and fixing the interface tower 300 to the DUT-boards 30 (cf. FIG. 1).

Figure 2A:
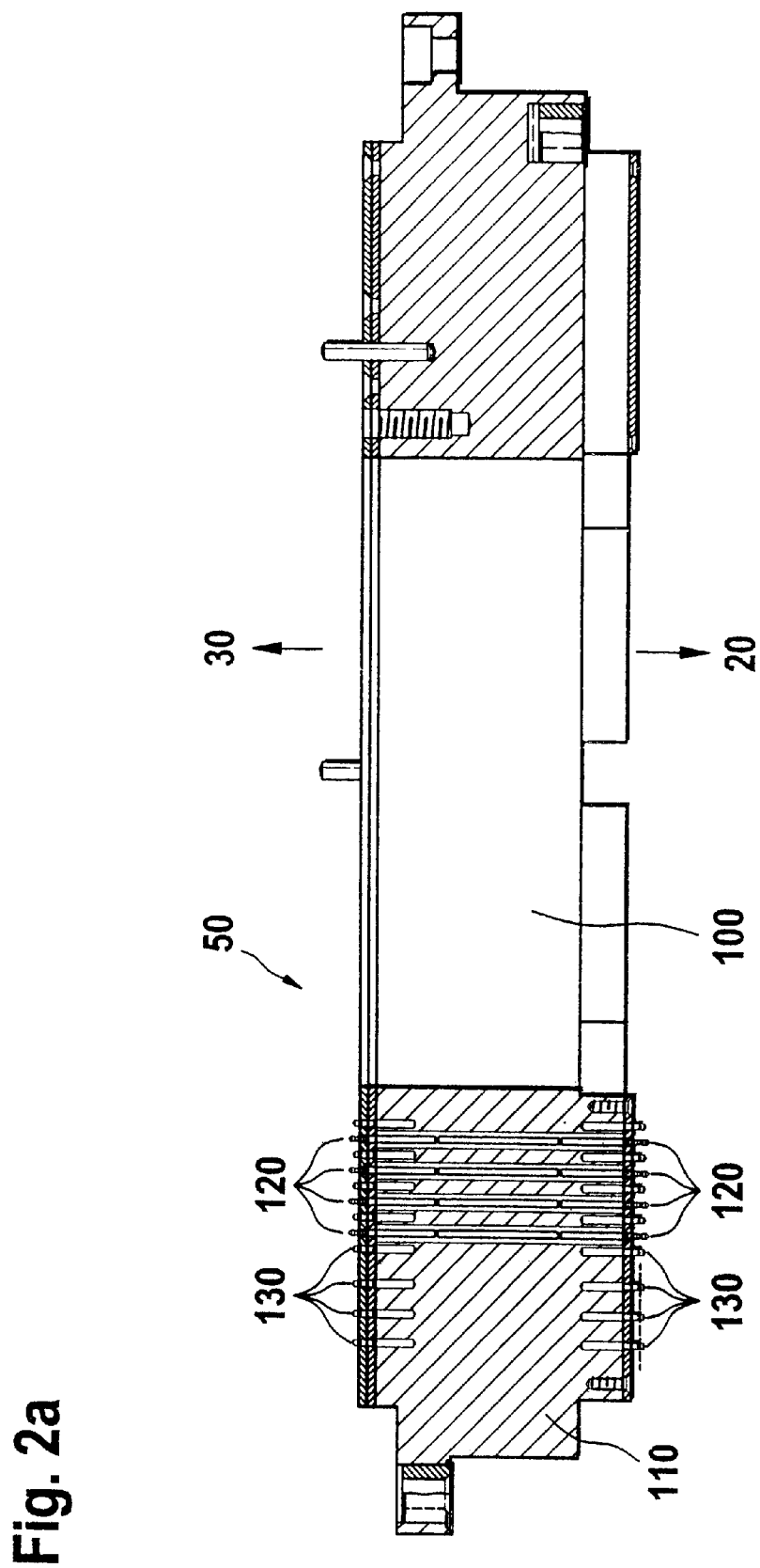
FIGS. 2A and 2B show an embodiment of the interface tower 50.
Figure 2B:
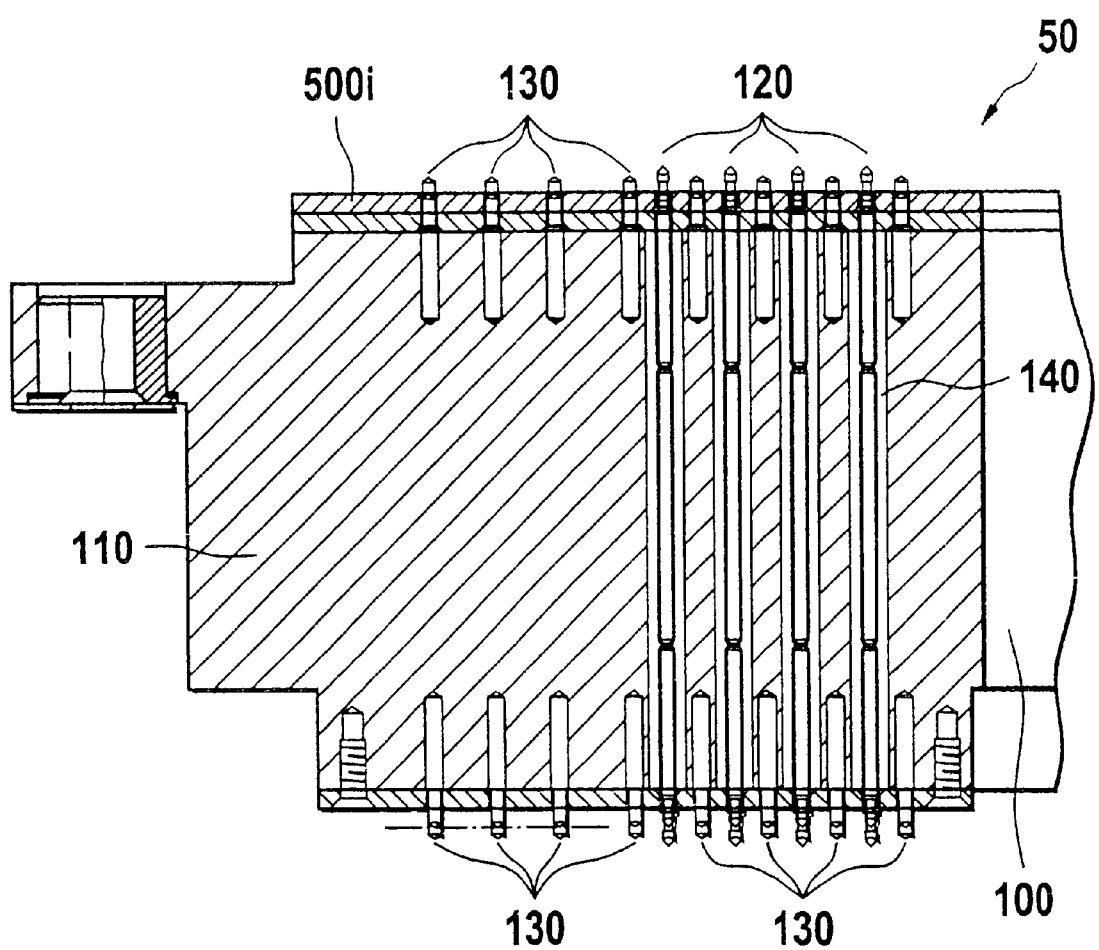

The arrangement of the signal paths 120 and the ground contacts 130 in the segments 320$i$ is preferably provided in the same way as depicted in FIG. 2B. Each ground contact 120 contacts directly with the solid core of the body 350$i$. Preferably, the body 350$i$, at least for the segments 320$i$ with electrical contacts 120 and 130, is provided by a solid aluminum core.

In a preferred embodiment, each segment 320$i$ is electrically insulated from the frame 305 and/or other segments 320$i$. For that purpose, an insulating layer 400 (preferably an epoxy layer) is arranged between the flanges 340$i$ of the segments 320$i$ and the upper side of the frame 305. Between side walls 410$i$ around each segment 320$i$ and inner walls 420$i$ of each recess 310$i$, an insulation might be provided e.g. by a coating over the outside walls 410$i$ and/or the outside walls 420$i$ of the frame 305. Alternatively or in addition thereto, an air gap (e.g. 0.5 mm) might be provided between the outside walls 410$i$ and 420$i$ of the segments 320$i$ and the recesses 310$i$. Further insulation might be provided with respect of the mechanical fixing of the segments 320*i* to the frame 305. Preferably the head of the screws 330 will only come in contact with an insulating layer 500*i* (preferably an epoxy layer) provided on the top side of each segment 320*i* (cf. in particular FIG. 2B), while the bodies of the screws 330 are spaced apart from the flange 340*i*, so that no electrical contact will be provided by the screws 330 between the segments 320*i* and the frame 305.

In the embodiment of FIG. 3, all segments 320*i* preferably have the same mechanical dimensions, but are capable of taking over different tasks. This allows configuring the interface tower 300 in accordance with the special applications. The interface tower 300 can e.g. be split into analog and digital areas comprised of one or more of the segments 320*i*, whereby each area can have its own electrical ground condition. The segments 320*i* can be designed for different pin-counts and different performance requirements. Thus, the user of the test system will be able to upgrade the interface tower 300 when the pin count of the test system increases or if higher performance is required.

Mechanical and electrical contact between the interface tower 300 and the DUT board 30 as well as between the interface tower 300 and the probe card 20 is generally provided by mechanically pressing the components against each other. Contact might be provided manually e.g. using locking means such as screws, semi-automatically e.g. using bayonet slide locks or lever systems, or automatically e.g. using automatic loading mechanisms of the prober 10 and/or the tester 25.

What is claimed is:

1. An interface for providing electric signal links between test equipment and application equipment, the interface comprising a metal frame for receiving a plurality of individual structures, the structures including a metal core having plural electric paths substantially within and shielded by the core for providing the signal links, the frame being arranged for receiving the structures so portions of the structures can abut portions of the frame, at least one of the frame and structures including electric insulation for preventing electric contact between the frame and structures.

2. The interface of claim 1 wherein the frame and structures are arranged so that a pair of the structures can be located in the frame so portions of the pair of structures can abut, at least one of the pair of structures including electric insulation for preventing electric contact between the pair of structures.

3. The interface of claim 2 wherein the different signal paths include electromagnetic paths for electric and optical electromagnetic links between opposite faces of the core.

4. The interface of claim 3 wherein each electric electromagnetic link includes a center conductor surrounded by an air hole in the core, the core surrounding the air hole and forming a ground plane conductor for the electromagnetic path.

5. The interface of claim 3 wherein the frame includes a plurality of recesses, each of the recesses being arranged for receiving one of the structures.

6. The interface of claim 5 wherein each of the recesses has substantially the same shape and each of the structures has substantially the same shape, the shapes of the recesses and structures being such that the structures can nest in the recesses.

7. The interface of claim 6 wherein the test equipment comprises an integrated circuit tester and the application equipment comprises integrated circuit handling equipment.

8. The interface of claim 1 wherein the frame includes a plurality of recesses, each of the recesses being arranged for receiving one of the structures.

9. The interface of claim 8 wherein each of the recesses has substantially the same shape and each of the structures has substantially the same shape, the shapes of the recesses and structures being such that the structures can nest in the recesses.

10. The interface of claim 1 wherein the test equipment comprises an integrated circuit tester and the application equipment comprises integrated circuit handling equipment.

11. An interface for providing electric signal links between test equipment and application equipment, the interface comprising a frame for receiving a plurality of individual structures, the structures including a metal core having plural electric paths substantially within and shielded by the core for providing the signal links, the frame being arranged for receiving the structures so that a pair of the structures can be located in the frame so portions of the pair of structures can abut, at least us one of the pair of structures including electric insulation for preventing electric contact between the pair of structures.

12. The interface of claim 11 wherein the different signal paths include electric and optical electromagnetic paths for electromagnetic links between opposite faces of the core.

13. The interface of claim 12 wherein each electric electromagnetic link includes a center conductor surrounded by an air hole in the core, the core surrounding the air hole and forming a ground plane conductor for the electromagnetic path.

14. The interface of claim 13 wherein the frame includes a plurality of recesses, each of the recesses being arranged for receiving one of the structures.

15. The interface of claim 14 wherein each of the recesses has substantially the same shape and each of the structures has substantially the same shape, the shapes of the recesses and structures being such that the structures can nest in the recesses.

16. The interface of claim 15 wherein the test equipment comprises an integrated circuit tester and the application equipment comprises integrated circuit handling equipment.

17. The interface of claim 11 wherein the frame includes a plurality of recesses, each of the recesses being arranged for receiving one of the structures.

18. The interface of claim 17 wherein each of the recesses has substantially the same shape and each of the structures has substantially the same shape, the shapes of the recesses and structures being such that the structures can nest in the recesses.

19. The interface of claim 11 wherein the test equipment comprises an integrated circuit tester and the application equipment comprises integrated circuit handling equipment.

20. An interface for providing electric signal links between test equipment and application equipment, the interface comprising a frame receiving a plurality of individual structures, the structures including a metal core having plural electric paths substantially within and shielded by the core for providing the signal links, the frame receiving the structures so that a pair of the structures are located in the frame so portions of the pair of structures abut, at least one of the pair of structures including electric insulation that prevents electric contact between the pair of structures.

21. The interface of claim 20 in combination with the test equipment and application equipment, the test equipment being located on a first side of the metal frame and having electric connections between terminals thereof and a first side of the metal core on the first side of the metal frame, the application equipment being located on a second side of the metal frame and having electric connections between terminals thereof and a second side of the metal core on the second side of the metal frame.

22. The interface of claim 21 wherein the frame includes a plurality of recesses, each of the recesses receiving one of the structures.

23. The interface of claim 22 wherein each of the recesses has substantially the same shape and each of the structures has substantially the same shape, the shapes of the recesses and structures being such that the structures nest in the recesses.

24. An interface for providing electric signal links between test equipment and application equipment, the interface comprising a metal frame receiving a plurality of individual structures, the structures including a metal core having plural electric paths substantially within and shielded by the core for providing the signal links, the frame receiving the structures so portions of the structures abut portions of the frame, at least one of the frame and structures including electric insulation that prevents electric contact between the frame and structures.

25. The interface of claim 24 wherein the frame and structures are arranged so that a pair of the structures are located in the frame so portions of the pair of structures abut, at least one of the pair of structures including electric insulation that prevents electric contact between the pair of structures.

26. The interface of claim 25 in combination with the test equipment and application equipment, the test equipment being located on a first side of the metal frame and having electric connections between terminals thereof and a first side of the metal core on the first side of the metal frame, the application equipment being located on a second side of the metal frame and having electric connections between terminals thereof and a second side of the metal core on the second side of the metal frame.

27. The interface of claim 26 wherein the frame includes a plurality of recesses, each of the recesses receiving one of the structures.

28. The interface of claim 27 wherein each of the recesses has substantially the same shape and each of the structures has substantially the same shape, the shapes of the recesses and structures being such that the structures nest in the recesses.

29. The interface of claim 24 in combination with the test equipment and application equipment, the test equipment being located on a first side of the metal frame and having electric connections between terminals thereof and a first side of the metal core on the first side of the metal frame, the application equipment being located on a second side of the metal frame and having electric connections between terminals thereof and a second side of the metal core on the second side of the metal frame.

30. The interface of claim 29 wherein the frame includes a plurality of recesses, each of the recesses receiving one of the structures.

31. The interface of claim 30 wherein each of the recesses has substantially the same shape and each of the structures has substantially the same shape, the shapes of the recesses and structures being such that the structures nest in the recesses.

* * * * *